(12) United States Patent
Maeda et al.

(10) Patent No.: US 6,346,433 B1
(45) Date of Patent: Feb. 12, 2002

(54) METHOD OF COATING SEMICONDUCTOR WAFER WITH RESIN AND MOLD USED THEREFOR

(75) Inventors: Keiji Maeda; Shigeru Miyagawa, both of Kyoto (JP)

(73) Assignee: Towa Corporation, Kyoto (JP)

( * ) Notice: Subject to any disclaimer, the term of this patent is extended or adjusted under 35 U.S.C. 154(b) by 0 days.

(21) Appl. No.: 09/523,420

(22) Filed: Mar. 10, 2000

(30) Foreign Application Priority Data

Mar. 10, 1999 (JP) ............................................ 11-064086
Mar. 10, 1999 (JP) ............................................ 11-064102

(51) Int. Cl.[7] .............................................. H01L 21/50
(52) U.S. Cl. ..................... 438/108; 438/106; 438/120; 438/127; 257/787; 65/140; 425/233
(58) Field of Search ................................. 438/106, 107, 438/108, 109, 110, 111, 112, 113, 114, 115, 116, 117, 118, 119, 120, 121, 122, 123, 124, 125, 126, 127, 26; 65/140, 138, 139; 425/233, 344; 257/787

(56) References Cited

U.S. PATENT DOCUMENTS

| | | | | |
|---|---|---|---|---|
| 3,514,849 A | * | 6/1970 | Landron ........................ | 29/588 |
| 5,304,512 A | * | 4/1994 | Arai et al. .................... | 437/211 |
| 5,986,340 A | * | 11/1999 | Mostafazadeh et al. ...... | 257/713 |
| 6,046,077 A | * | 4/2000 | Baba ........................... | 438/127 |
| 6,084,308 A | * | 7/2000 | Kelkar et al. ................ | 257/777 |
| 6,125,043 A | * | 9/2000 | Hauer et al. ................. | 361/760 |
| 6,133,066 A | * | 10/2000 | Murakami .................... | 438/108 |
| 6,204,095 B1 | * | 3/2001 | Farnworth .................... | 438/127 |

FOREIGN PATENT DOCUMENTS

| | | | | |
|---|---|---|---|---|
| JP | 06291221 A | * | 10/1994 | ........... H01L/23/28 |
| JP | 09219421 A | * | 8/1997 | ........... H01L/21/60 |
| JP | 10107066 A | * | 4/1998 | ........... H01L/21/60 |

* cited by examiner

*Primary Examiner*—Charles Bowers
*Assistant Examiner*—Renzo N. Rocchegiani
(74) *Attorney, Agent, or Firm*—W. F. Fasse; W. G. Fasse

(57) ABSTRACT

In a method of coating a semiconductor wafer with a resin of the present invention, first, a semiconductor wafer is placed on a bottom surface of a cavity provided in a molding surface of a lower mold of a mold with its surface having a bump facing upward. Thereafter, a required amount of resin material is supplied to cavity, and a film for exposing the bump is applied to a molding surface of the upper one of the molds. In this state, molds are closed together. Resin material is heated to melt in cavity. Then, film is pressed against the bottom surface of cavity by a pressing member provided on the molding surface of the upper mold, so that film is abutted against a leading edge of bump in cavity. A pressure is applied to the resin in cavity through film, and the surface having the bump of semiconductor wafer is coated with resin. According to the method, pressing member is provided on the upper mold, so that melted resin does not enter a sliding portion. Accordingly, productivity of the resin-coated wafer increases and a resin-coated wafer with high quality and reliability is obtained.

17 Claims, 8 Drawing Sheets

METHOD OF COATING SEMICONDUCTOR WAFER WITH RESIN AND MOLD USED THEREFOR

BACKGROUND OF THE INVENTION

1. Field of the Invention

The present invention relates to methods of coating a semiconductor wafer with resin for coating a surface of the semiconductor having a solder bump (a protruding electrode) or the like with resin and an improved mold therefor.

2. Description of the Background Art

Conventionally, a soft and breakable bump is protected and reinforced by coating a surface of a semiconductor chip having a bump with resin, for example in a chip size package (CSP). The operation of coating the chip with the resin is performed at the stage of manufacturing a semiconductor wafer (at a wafer level).

For example, using a mold for coating with resin shown in FIGS. 8A and 8B, the surface having a bump of the semiconductor wafer is coated with resin to produce a resin-coated wafer. Then, the resin-coated wafer is cut into a number of resin-coated chips.

More specifically, the mold shown in FIGS. 8A and 8B has an upper mold 81 and a lower mold 82, which are opposed. A film 83 for exposing a bump (for preventing a bump from being covered with resin) is applied onto the molding surface of upper mold 81. Lower mold 82 is provided with a cavity 85 for resin coating in which a semiconductor wafer 84 with a bump 88 is supplied and set, a fitting hole 86 including cavity 85, and a bottom member 87 defining a bottom of cavity 85 which vertically moves in fitting hole 86.

As shown in FIG. 8A, film 83 is applied to the molding surface of upper mold 81, and semiconductor wafer 84 is set in cavity 85 with its surface with the bump facing upward. Thereafter, a required amount of resin material 89 is supplied onto the surface with the bump, upper and lower molds 81, 82 are closed together, and resin material 89 in cavity 85 is heated to melt.

As shown in FIG. 8B, bottom member 87, along with semiconductor wafer 84 placed thereon, is moved upwardly in cavity 85, so that the leading edge of bump 88 is abutted against film 83. At the time, at least the surface of wafer 84 with the bump is coated with the resin. Thus, the portion of bump 88 that is abutting against film 83 (the leading edge of the bump) is exposed from resin (i.e., not in contact with resin) on the surface coated with resin (the surface with the bump) of resin-coated wafer 90 in cavity 85.

However, the melted resin enters a gap between fitting hole 86 and bottom member 87 (a sliding portion) and cured therein. Then, a resin burr (a hardened resin) is caused in the gap, which prevents bottom member 87 from sliding. As a result, the resin burr in the gap must frequently be removed, thereby decreasing productivity of resin-coated wafer 90.

Further, such a sliding problem prevents application of a sufficient pressure on the resin in the cavity by bottom member 87, whereby bump 88 cannot be abutted against film 83 but entirely buried in the resin. In this case, bump 88 cannot be used for external connection. As a result, the resin-coated wafer (resin-coated chip) with high quality and reliability is not provided.

SUMMARY OF THE INVENTION

One object of the present invention is to provide a method of coating a semiconductor wafer with resin for increasing productivity of a resincoated wafer, and to provide a mold used therefor.

Another object of the present invention is to provide a method of coating a semiconductor wafer with resin for ensuring a resin-coated wafer with high quality and reliability, and to provide a mold used therefor.

In the method of coating a semiconductor wafer with resin according to the present invention with which the above mentioned objects are achieved, first, a semiconductor wafer with its surface having a bump facing upward is placed in a prescribed position on the bottom surface of the cavity provided on a molding surface of one part of the mold (one mold) for resin coating. The mold has two parts whose molding surfaces are opposed. Thereafter, a required amount of resin is provided in the cavity, and a film for exposing the bump from resin is applied onto a molding surface of the other part of the mold (the other mold). In this state, the molds are closed together and the resin is heated to melt in the cavity. Then, the film is pressed against the bottom surface of the cavity by a pressing member provided on the molding surface of the other mold, so that the film is abutted against the leading edge of the bump in the cavity and the resin in the cavity is pressed through the film. Thus, the surface having the bump of the semiconductor wafer is coated with resin.

In the method of coating the semiconductor wafer with resin, preferably, the cavity is provided in the lower mold and the pressing member is provided on the upper mold. Further, the film applying step causes application of the film on the molding surface of the upper mold.

According to the above described method, the pressing member is provided on the molding surface of the upper mold, and the pressing member and the molding surface of the upper mold are not brought into contact with the resin or the melted resin because of the film for exposing the bump. Thus, the problem associated with the conventional art caused by the melted resin entering the sliding portion of the pressing member is avoided. Therefore, when the resin-coated wafer is formed with the leading edge of the bump exposed from the resin (not in contact from the resin) by abutting the film against the leading edge of the bump of the semiconductor wafer, productivity of the resin-coated wafer is increased and a resin-coated wafer with high quality and reliability is provided.

Preferably, the semiconductor wafer is coated with resin while maintaining at least the cavity in a prescribed vacuum condition. Thus, formation of voids or defective portions in the resin, which is coating the surface with the bump of the semiconductor wafer, is efficiently prevented.

In a preferred embodiment of the method of coating the semiconductor wafer with resin of the present invention, in the film applying step, the film is attracted to the molding surface of the upper mold of the mold, rumples are effectively smoothed out and avoided.

Further, in the step of supplying the semiconductor wafer, preferably, the semiconductor wafer is adsorbed to the bottom surface of the cavity, so that the semiconductor wafer is surely and stably fixed.

In another preferred embodiment of the method of coating the semiconductor wafer with resin according to the present invention, in the step of closing the upper and lower molds of the mold together, at least the cavity is brought into the prescribed vacuum condition. The vacuum is drawn with the upper and lower molds half-dosed (not completely dosed) with a prescribed space therebetween.

The mold for resin coating of the present invention which is applied to the above described method of coating the semiconductor wafer with resin includes: a stationary mold and a movable mold arranged such that molding surfaces thereof are opposed; a cavity provided in the molding surface of one mold; a heating device heating to melt the resin in the cavity; a film for exposing bump which is applied on the molding surface of the other mold; and a pressing member provided on the other mold for pressing the film against the bottom surface of the cavity.

Preferably, the mold for resin coating is further provided with a horizontally adjusting device for horizontally adjusting the surface having the bump of the semiconductor device place on the bottom surface of the cavity. Such a horizontally adjusting device allows the surface having the bump of the wafer to be horizontally adjusted even if there is a variation in thickness of the wafer. As a result, the film can efficiently be abutted against the leading edge of the bump.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1A:
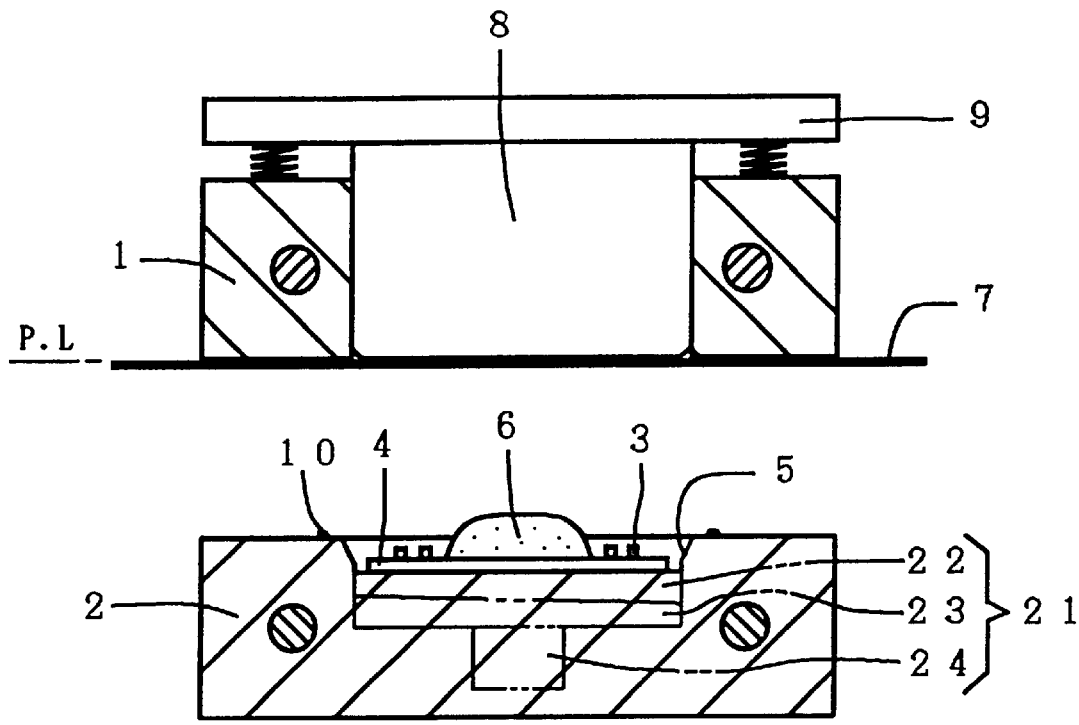
FIGS. 1A and 1B are cross sectional views schematically showing a mold for coating a semiconductor wafer with resin according to a first embodiment of the present invention, respectively showing the mold in open and closed states.
Figure 1B:
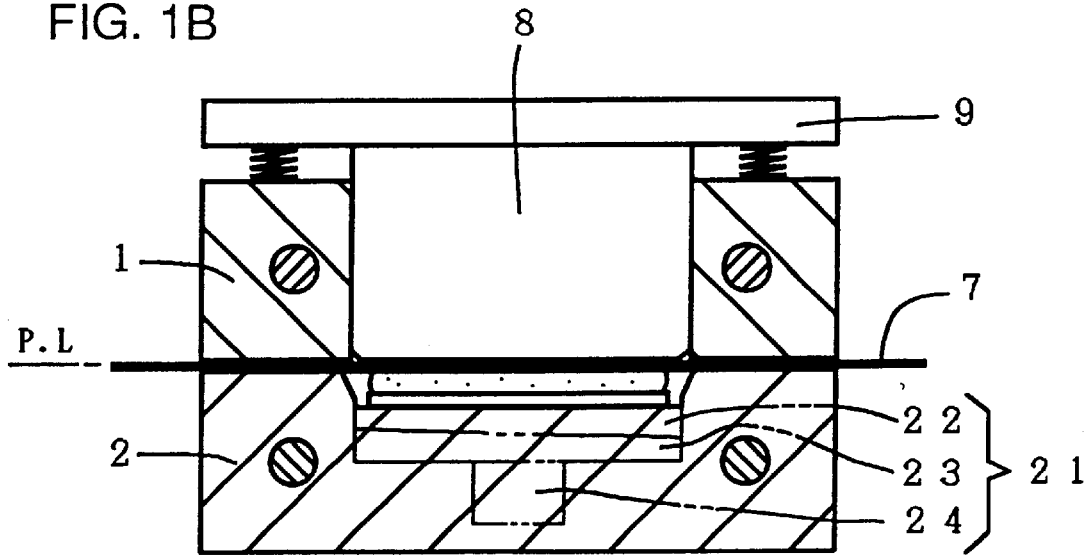

Now, the first embodiment of the present invention will be described with reference to FIGS. 1A and 1B. Referring first to FIGS. 1A and 1B, a mold of the present embodiment includes a stationary upper mold 1, and a vertically movable lower mold 2 opposed to upper mold 1.

Provided in a molding surface of lower mold 2 is a cavity 5 for resin coating in which a semiconductor wafer 4 having a bump (a protruding electrode) 3 is placed with the surface having the bump facing upward. A resin material 6, for example in a powder or particle form, can be supplied by a required amount in a prescribed position on the surface of the wafer having he bump on the bottom surface of cavity 5.

Further, a film 7 for exposing the bump (a film for preventing the leading edge of the bump from being in contact with resin) is applied onto the molding surface of upper mold 1. Upper mold 1 has a pressing member 8 with a pressing surface (an upper mold surface) corresponding to a shape of cavity 5 of lower mold 2 when viewed from above, and a vertically adjusting mechanism 9 for vertically moving pressing member 8.

Accordingly, when pressing member 8 is downwardly moved by vertically moving mechanism 9, film 7 is abutted against the leading edge of bump 3 and a prescribed pressure can be applied to the resin in cavity 5 through film 7.

Further, an engaging portion (an annular protrusion) 10 for engaging and fixing film 7 to the molding surface of the mold is provided on the peripheral portion (on the molding face of the lower mold) of cavity 5. As film 7 is retained between molding surfaces of upper and lower molds 1 and 2 in closing upper and lower molds 1 and 2 together, any rumple of film 7 can efficiently be smoothed out or avoided. Thus, film 7 can be retained between molding surfaces of upper and lower molds 1, 2 without any rumple.

A heater 15 for heating the temperature of the resin up to a setting temperature is provided in the mold of the present embodiment. Thus, resin material 6 in cavity 5 can be heated to melt.

Figure 3A:
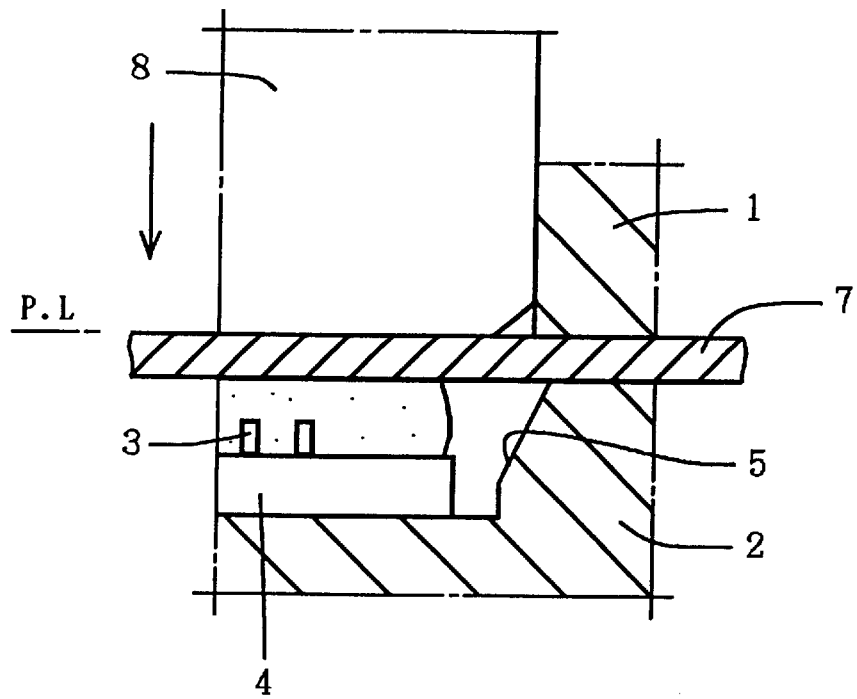
FIGS. 3A and 3B are partial cross sectional views schematically showing in enlargement main portions of the mold shown in FIGS. 1B and 2A, respectively.

An operation related to the mold of the present embodiment having the above described structure is as follows. As shown in FIG. 1A, first, film 7 is applied to the molding surface of upper mold 1. Semiconductor wafer 4 is set in a prescribed position on the bottom surface of cavity 5 with its surface having the bump facing upward. Thereafter, resin material 6 is supplied by a required amount on the surface with bump 3. Then, as shown in FIGS. 1B and 3A, upper and lower molds 1 and 2 are closed together. Film 7 can be retained and fixed between the molding surfaces of the molds by engaging portion 10, and resin material 6 in cavity 5 is heated to melt by heater 15.

Figure 2A:
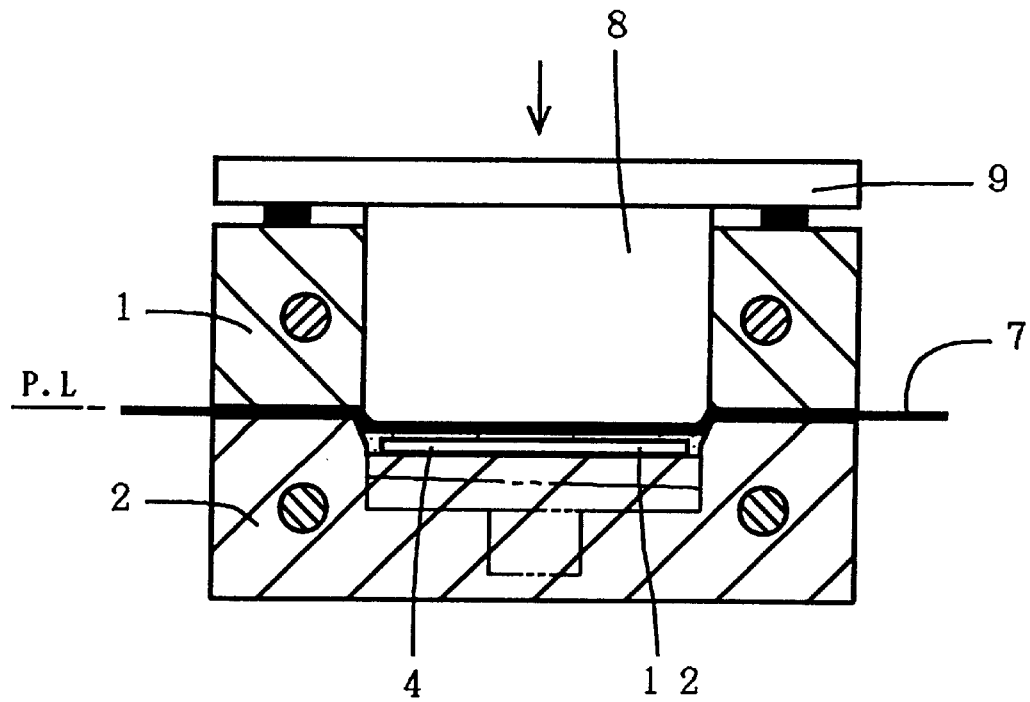
FIGS. 2A and 2B are cross sectional views schematically showing the mold for coating a semiconductor wafer with resin according to the first embodiment of the present invention, respectively showing states in which a film is abutted against a leading edge of a bump of the semiconductor wafer and in which the molds are not closed together and the resin-coated wafer is separated from the mold.
Figure 3B:
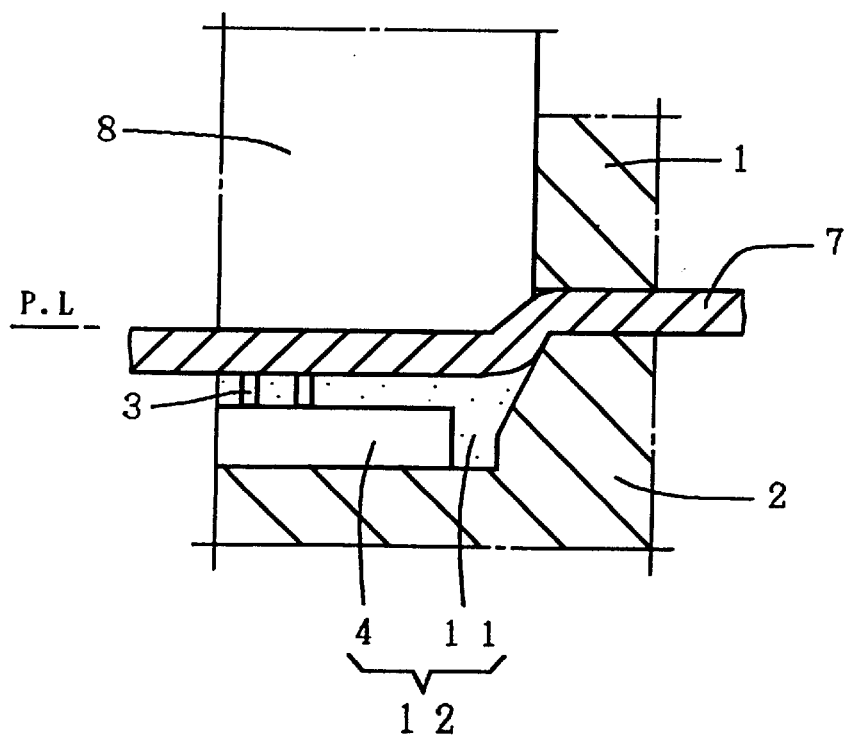

Then, as shown in FIGS. 2A and 3B, pressing member 8 is pressed against the molding surface of lower mold 2 in cavity 5 by vertically adjusting mechanism 9, so that film 7 is pressed into cavity 5 and smoothed out. Thus, film 7 is abutted against the leading edge of bump 3 and a prescribed pressure is applied to the resin in cavity 5 by a pressing member 8 through film 7. At the time, at least the leading edge of bump 3 is prevented from being brought into contact with the resin because of film 7.

Further, as pressing member 8 uniformly presses and smoothes out film 7, efficiently, a rumple is not caused to film 7. In addition, the resin is tightly encapsulated in cavity 5 as cavity 5 is sealed by film 7.

It is noted that as pressing member 8 produces the rumple avoiding function and effect of film 7, engaging portion 10 for engaging and fixing film 7 is not necessarily required. However, provision of engaging portion 10 produces a more efficient synergetic effect of surely avoiding a rumple of film 7.

Figure 2B:
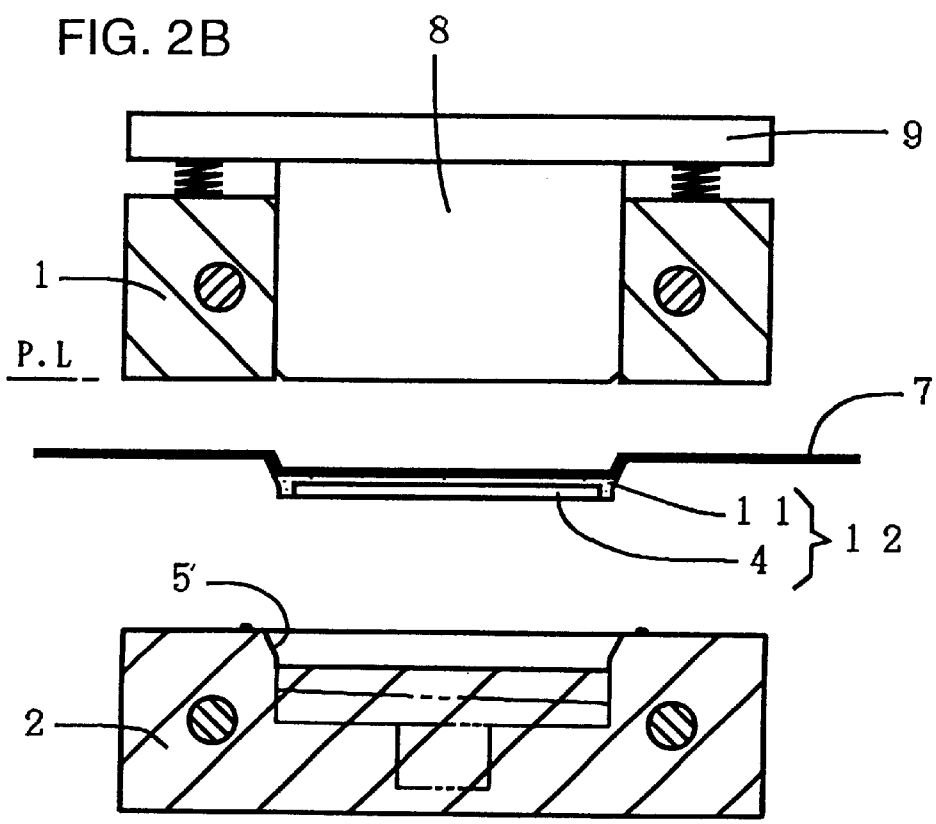

When a required amount of time is elapsed for curing, upper and lower molds 1, 2 are separated as shown in FIG. 2B, with resin-coated wafer 12 being applied to film 7 between the upper and lower molds.

With use of the mold according to the present embodiment which operate as described above, resin-coated wafer 12 is produced without providing a sliding portion in lower mold 2 and while exposing the leading edge of bump 3 on wafer 4 from resin 11. Accordingly, the problem with the melted resin entering the sliding portion as in the case of the conventional art is eliminated. As a result, productivity of the resincoated wafer is increased and the resin-coated wafer with high quality and reliability can be achieved. In the above described embodiment, when the surface having bump 3 of semiconductor wafer 4 is coated with resin by applying a pressure onto the resin through film 7 by pressing member 8, a prescribed vacuum is drawn at least into cavity 5 and the surface with bump 3 of semiconductor wafer 4 is coated with resin. In this case, formation of voids and defective portions in resin 11 coating the surface with bump 3 of semiconductor wafer 4 can efficiently be avoided.

Further, in the above described embodiment, there may be a variation in thickness of semiconductor wafer 4. In such a case, the surface having bump 3 of semiconductor wafer 4 placed on the bottom surface of cavity 5 may be inclined rather than horizontal. Thus, a horizontally adjusting device may be provided for horizontally adjusting the surface having the bump by appropriately moving the bottom surface of cavity 5.

As a horizontally adjusting device, for example, inclined members (a taper plates) each having an inclined surface (tapered surface) and a horizontal surface respectively at one and the other ends of a cylinder-like shape may be employed. More specifically, a taper plate mechanism 21 as the horizontally adjusting device may include an upper inclined member 22, a lower inclined member 23, and a rotating mechanism 24 rotating each of inclined members 22 and 23 about a center axis of the cylinder circle when viewed from above. One or both of inclined members 22 and 23 are suitably rotated by rotating mechanism 24 (see FIG. 1A and FIG. 1B).

More specifically, inclined members 22 and 23 are suitably rotated by rotating mechanism 24 to incline the bottom surface of cavity 5 defining horizontally adjusting device 21 to horizontally set the surface having the bump of semiconductor wafer 4. Accordingly, film 7 can efficiently be abutted against the leading edge of bump 3 of semiconductor wafer 4.

It is noted that taper plate mechanism 21 can be provided in pressing member 8 of upper mold 1 rather than in lower mold 2. More specifically, for example, taper plate mechanism 21 is provided in pressing member 8 for suitably inclining the pressing surface of pressing member 8 such that it is parallel to the surface having the leading edge of bump 3 in cavity 5 while downwardly moving pressing member 8. Thus, film 7 is pressed and abutted against the leading edge of inclined bump 3 in cavity 5, while being smoothed out. As a result, film 7 can efficiently be abutted against the leading edge of semiconductor wafer 4.

Furthermore, in the present embodiment, film 7 can be fixed to the molding surface of the upper mold by forcibly sucking it from a suction hole formed in the molding surface of the upper mold. Such a structure efficiently prevents a rumple of the film applied to the molding surface of the upper mold.

Second Embodiment

The second embodiment of the present invention will be described with reference to FIGS. 4A to 6B. It is noted that the portions which are the same as those of the first embodiment will be denoted by the same reference numerals and description thereof will not be repeated in the present embodiment.

Figure 4A:
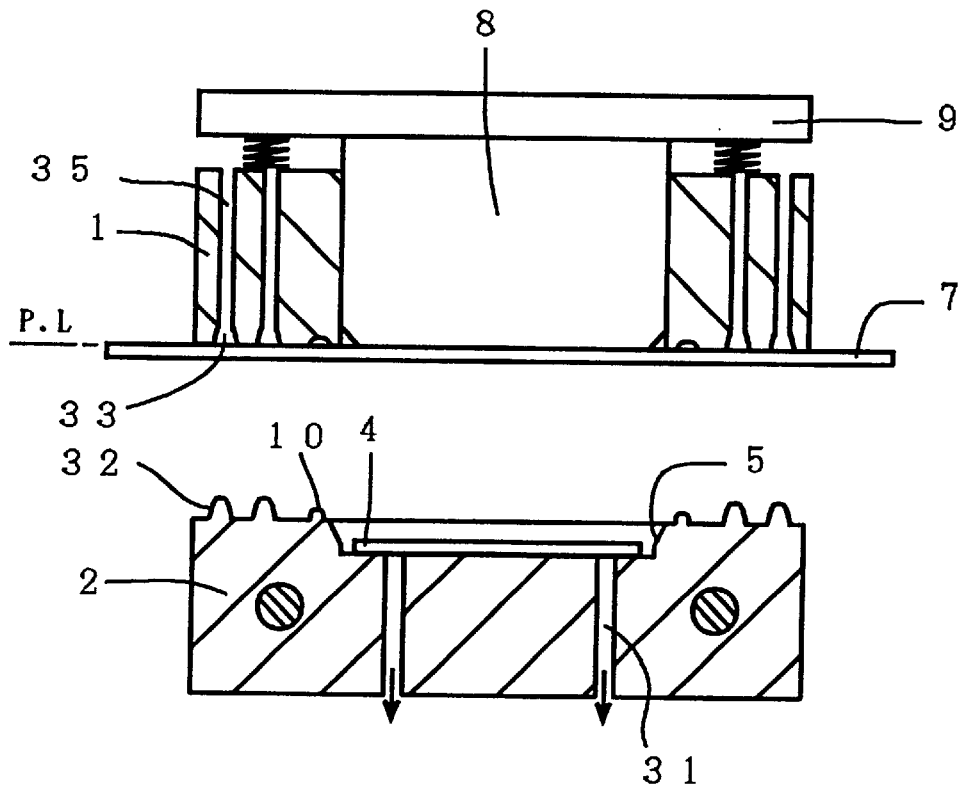
FIGS. 4A and 4B are cross sectional views schematically showing a mold for coating a semiconductor wafer according to a second embodiment of the present invention, respectively showing a positional relationship between a film and a semiconductor wafer as well as the film adhered to the upper mold.

The structure of the mold according to the second embodiment of the present invention is different from the first embodiment in the following respect. As shown in FIG. 4A, mold cavity 5 is provided with a required number of suction holes 31 as a means for attracting and fixing semiconductor to the bottom surface of mold cavity 5. Accordingly, when semiconductor wafer 4 is placed on mold cavity 5, a vacuum is drawn from suction holes 31 of mold cavity 5, so that semiconductor wafer 4 is attracted and fixed in a prescribed position on the bottom surface of mold cavity 5.

Figure 4B:
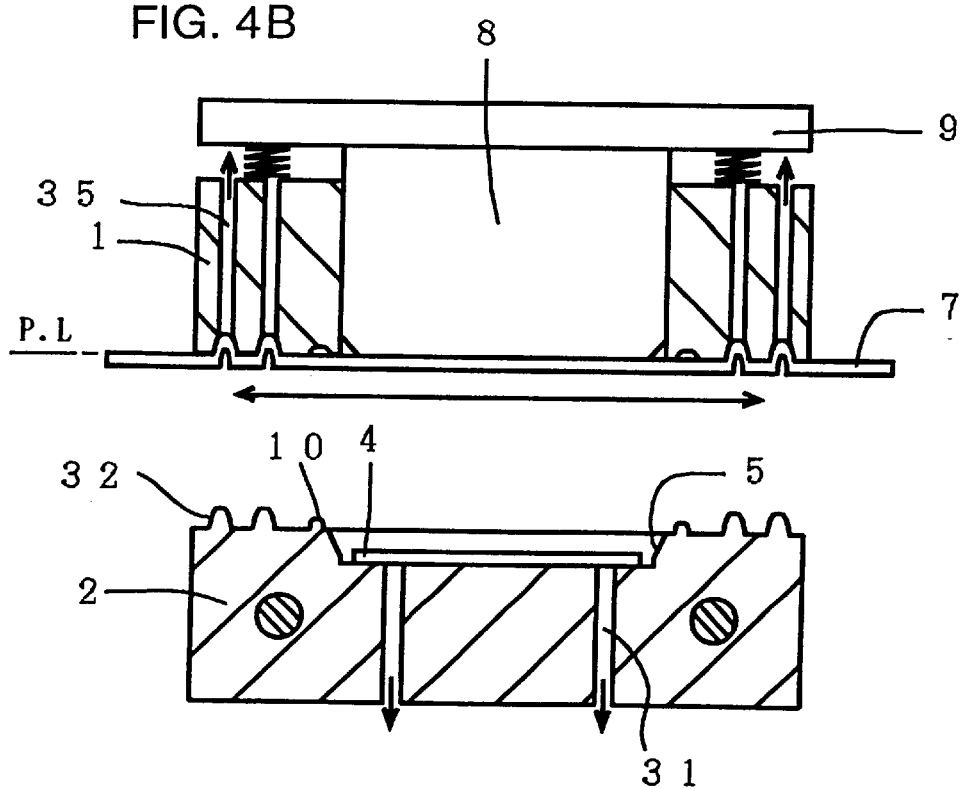

Further, as shown in FIGS. 4A and 4B, in a prescribed position on the molding surfaces of the upper and lower molds at the periphery of engaging portion 10 provided in the periphery of cavity 5 in the lower mold, a fixing member is provided for fixing film 7 between upper and lower molds when upper and lower molds 1 and 2 are closed. The fixing member includes an annular protrusion 32 provided on the molding surface of the lower mold, an annular recess 33 provided in the molding surface of the upper mold in correspondence to annular protrusion 32, and absorbing and exhausting mechanism 35 provided in annular recess 33. Such a structure forcibly absorbs and exhausts air or the like by absorbing and exhausting mechanism 35 in the direction from annular recess 33 in the upper mold. Thus, film 7 can be attracted and fixed to the upper mold.

In addition, when upper and lower molds 1, 2 are closed, annular protrusion 32 and annular recess 33 are fitted together, and air or the like is forcibly absorbed and exhausted by absorbing and exhausting mechanism 35 in the direction from annular recess 33, so that film 7 is attracted to annular recess 33 and smoothed out. Thus, a rumple of film 7 is avoided. Further, one or a plurality of fixing members (a combination of annular recess 33 and annular protrusion 32) for the film may be provided.

In the mold of the present embodiment, a vacuum mechanism (not shown) may be provided for drawing a vacuum from an outside air excluding region 34 (FIG. 5B) including at least a molding portion, which is structured such that the molding portion including at least mold cavity 5 is free of outside air. The vacuum mechanism draws a vacuum to outside air excluding region 34 for bringing the molding portion including at least cavity 5 into a vacuum condition.

Figure 5A:
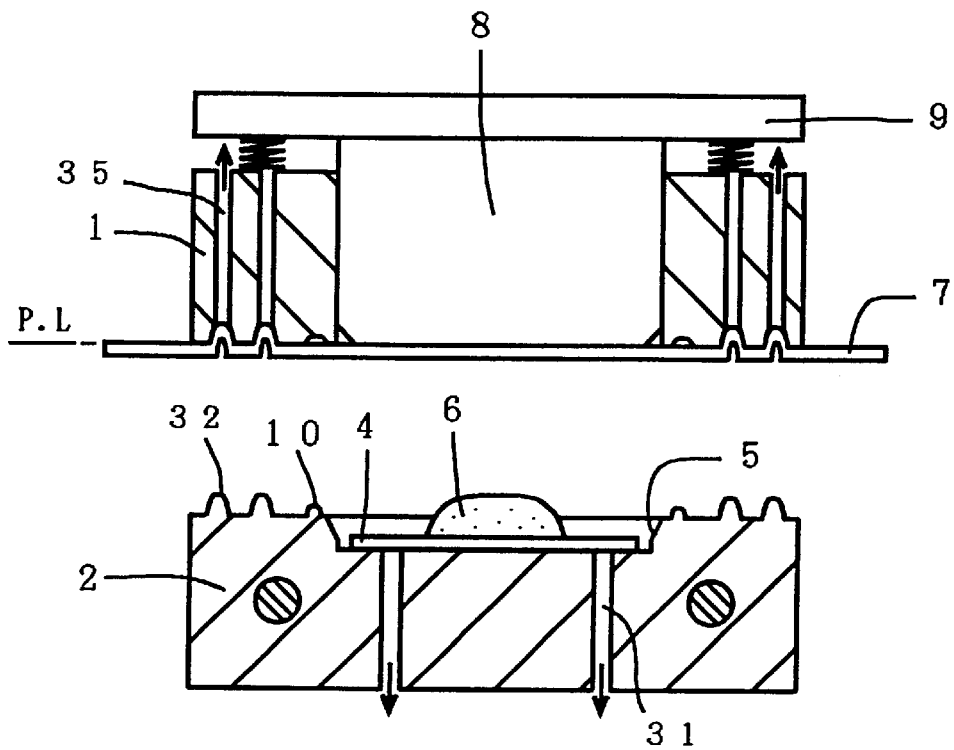
FIGS. 5A and 5B are cross sectional views schematically showing the mold of the semiconductor wafer according to the second embodiment of the present invention, respectively showing states in which resin is supplied and in which a vacuum is drawn into a cavity of the mold.

Next, the operation of the mold of the present embodiment having the above described structure will be described. First, as shown in FIG. 5A, film 7 is applied to the molding surface of upper mold 1, and air or the like is forcibly absorbed and exhausted form annular recess 33 of upper mold 1 by absorbing and discharging mechanism 35, so that film 7 is attracted and fixed to the upper mold. Thereafter, in the prescribed position on the bottom surface of cavity 5, semiconductor wafer 4 is set with its surface having bump 3 facing upward. A required amount of resin material 6 is supplied to the surface having the bump with semiconductor wafer 4, which is attracted and fixed to the bottom surface of cavity 5.

Figure 5B:
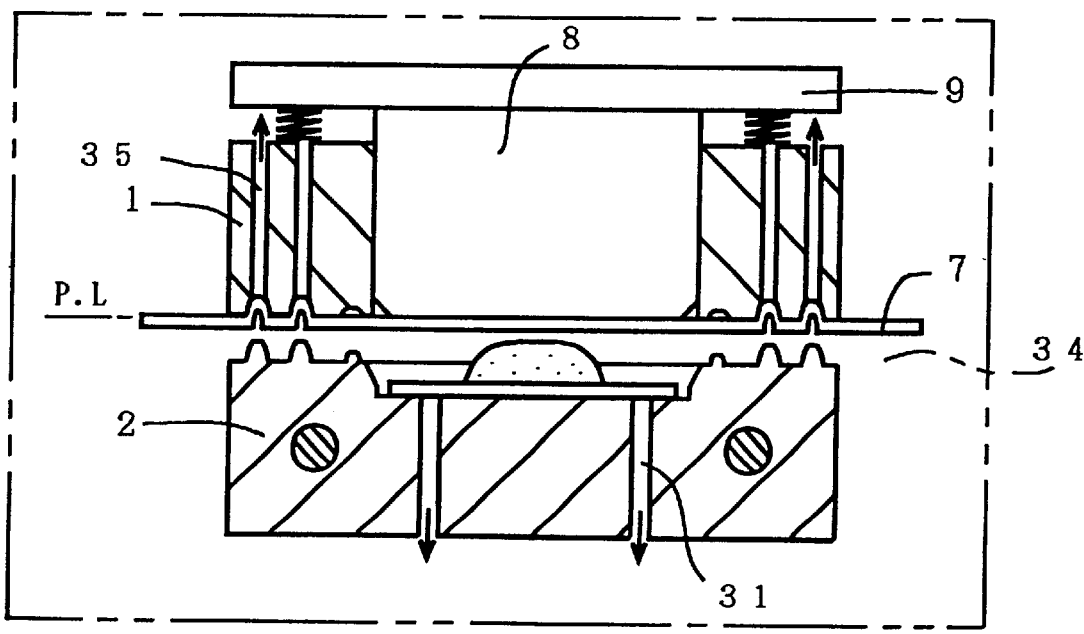

As shown in FIG. 5B, lower mold 2 is upwardly moved, so that a required space is obtained between the upper and lower molds. Outside air excluding region 34 is formed by bringing the molding portion including at least cavity 5 into an outside-air-free condition, and a vacuum is drawn to outside air excluding region 34 by the vacuum mechanism. Thus, outside air excluding region 34 including at least cavity 5 is brought into the prescribed vacuum condition.

Figure 6A:
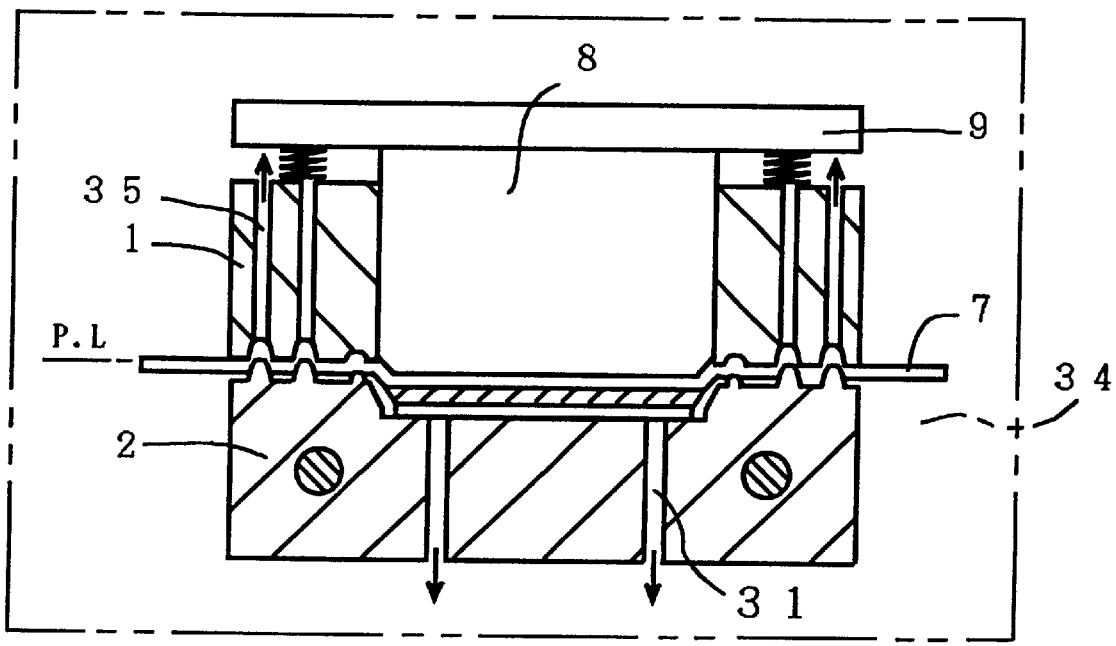
FIGS. 6A and 6B are cross sectional views schematically showing the mold of the semiconductor wafer according to the second embodiment of the present invention, respectively showing states in which a film is abutted against a leading edge of the semiconductor wafer and in which the molds of the mold is opened and a resin-coated wafer is separated from the mold.
Figure 6B:
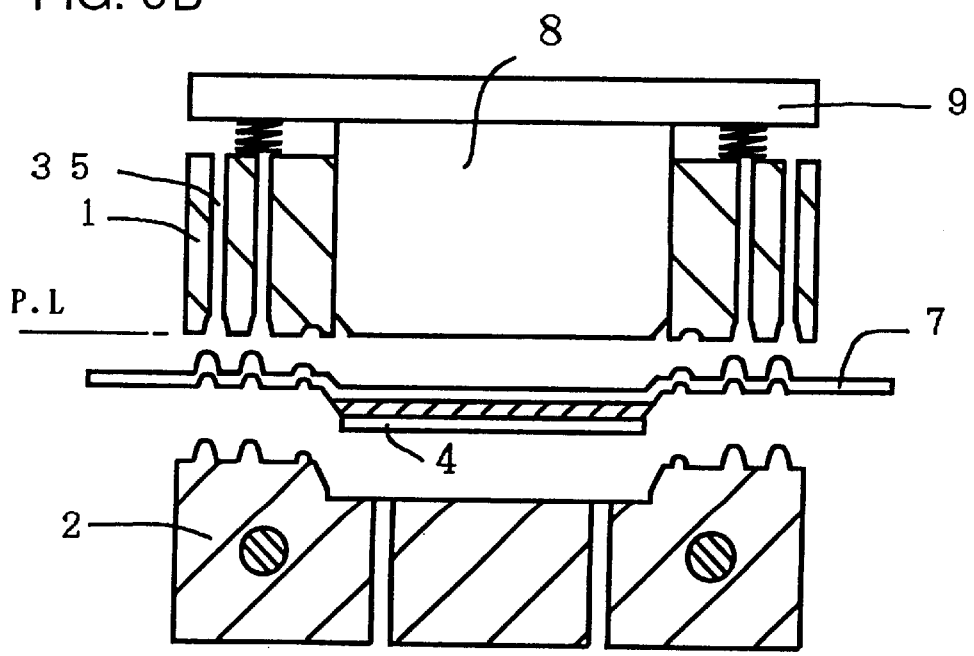

As shown in FIG. 6A, lower mold 2 is further moved upward to completely close the upper and lower molds, and annular recess 33 and annular protrusion 32 of the fixing portion are fitted together. At the time, film 7 is retained between upper and lower molds by engaging portion 10, and absorbed and smoothed out into annular recess 33. Thus, a rumpling of film 7 can efficiently be avoided.

Subsequently, resin material 6 in cavity 5 is heated to melt by a heater 15. Then, pressing member 8 is downwardly moved by vertically moving mechanism 9 so that the pressing surface of pressing member 8 is moved toward the bottom surface of cavity 5 of the lower mold. Film 7 is pressed against cavity 5 and smoothed out, and abutted against the leading edge of bump 3. A prescribed pressure is applied to the resin in cavity 5 through film 7 by pressing member 8. As a result, at least the leading edge of bump 3 is not brought into contact with the resin because of film 7 in cavity 5. Further, the film 7 is smoothed out and a rumple is avoided. In addition, cavity 5 is sealed by film 7. Thus, the resin is tightly encapsulated in cavity 5.

When a required period of time is elapsed for curing, upper and lower molds 1, 2 are opened and separated, with film 7 being applied to wafer 4 between upper and lower molds 1 and 2.

With use of the mold of the present embodiment which is used to operate as described above, as in the above described first embodiment, a sliding portion is not provided in the lower mold, and resin-coated wafer 12 is formed with the leading edge of bump on wafer 4 exposed from resin 11. As a result, the problem with the melted resin entering the sliding portion as in the above described conventional example is eliminated. Thus, productivity of the resin-coated wafer is increased and the resin-coated wafer with high quality and reliability is achieved.

Furthermore, as the molding portion including at least cavity 5 is brought into a prescribed vacuum condition for resin coating, formation of voids and defective portions in resin 11, which is coating the surface with bump 3 of semiconductor wafer 4, is effectively avoided.

In the present embodiment, when a plurality of fixing portions including annular recess 33, annular protrusion 32 and absorbing and exhausting mechanism 35 are provided, in closing the upper and lower molds, the absorbing and exhausting operation is forcibly perform ed on the plurality of fixing portions almost simultaneously, separately, sequentially starting from the outermost annular recess 33 or arbitrarily in an appropriate manner. Thus, film 7 is attracted to annular recess 33 and smoothed out, so that formation of a rumple of film 7 is avoided.

In half-dosing the upper and lower molds, lower mold 2 is not stopped but can be continuously moved upward.

Figure 7A:
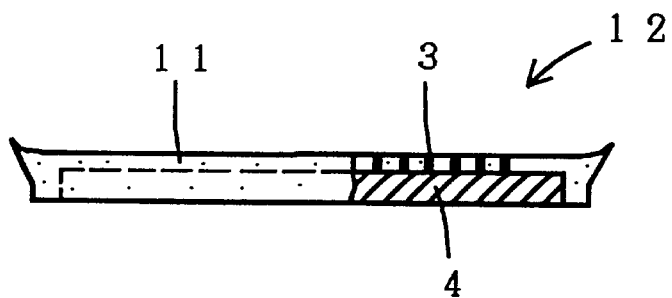
FIG. 7A is a moldial side view schematically showing the resin-coated wafer.
Figure 7B:
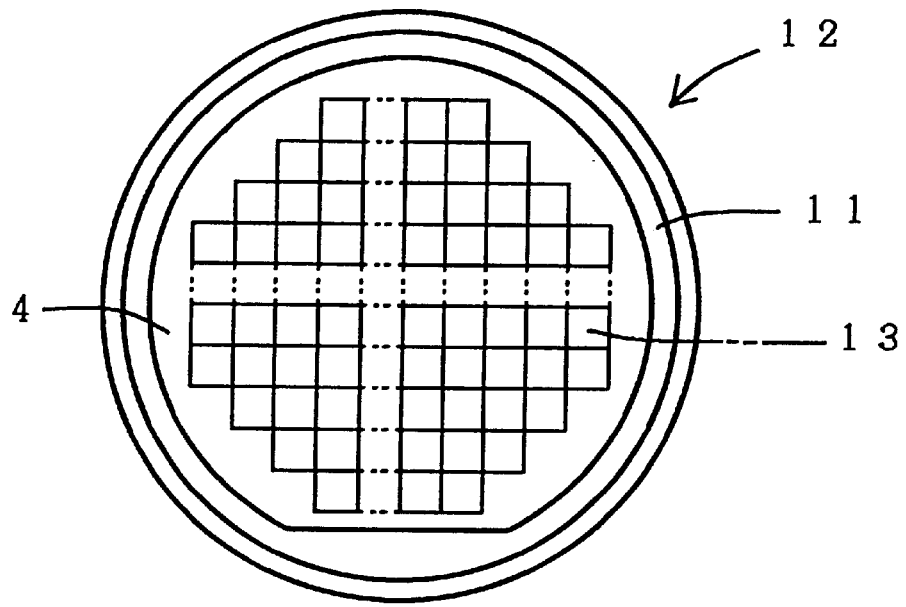
FIG. 7B is a bottom view schematically showing the resin-coated wafer shown in FIG. 7A.
Figure 7C:
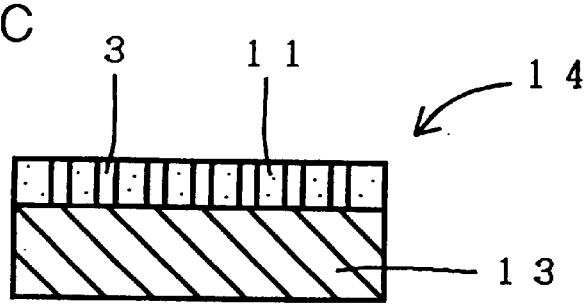
FIG. 7C is a cross sectional view schematically showing a resin-coated chip obtained by cutting the resin-coated wafer.
Figure 8A:
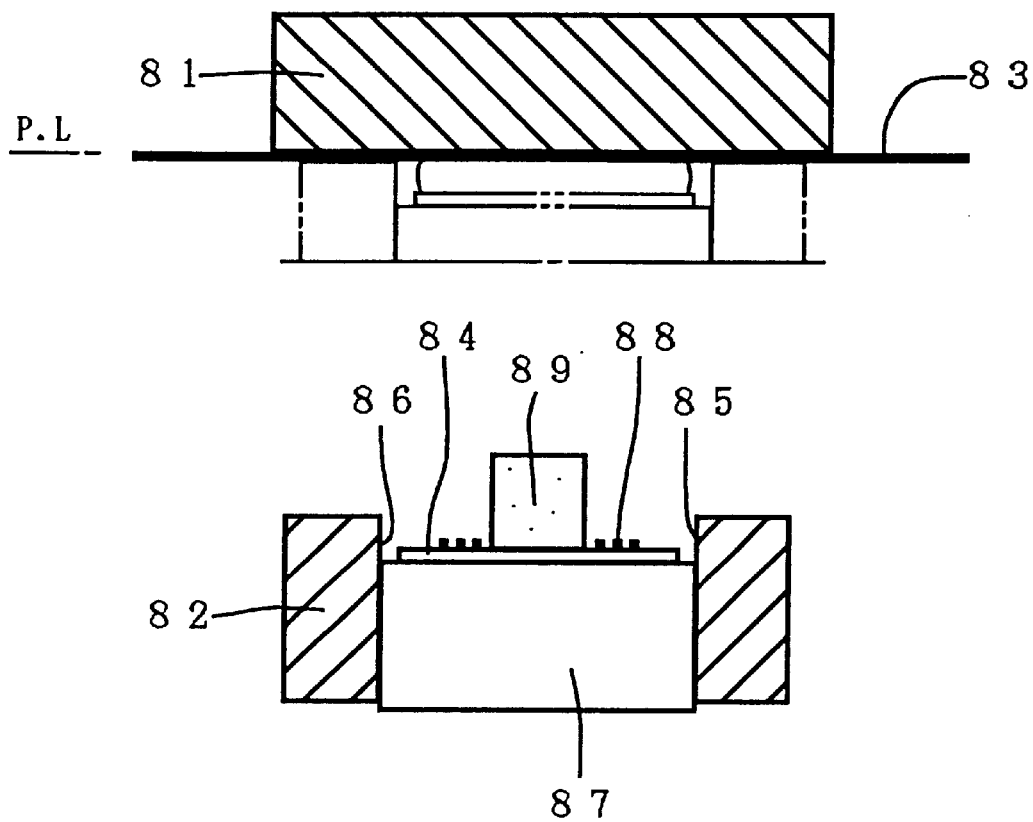
FIGS. 8A and 8B are cross sectional views schematically showing a conventional mold for resin coating.
Figure 8B:
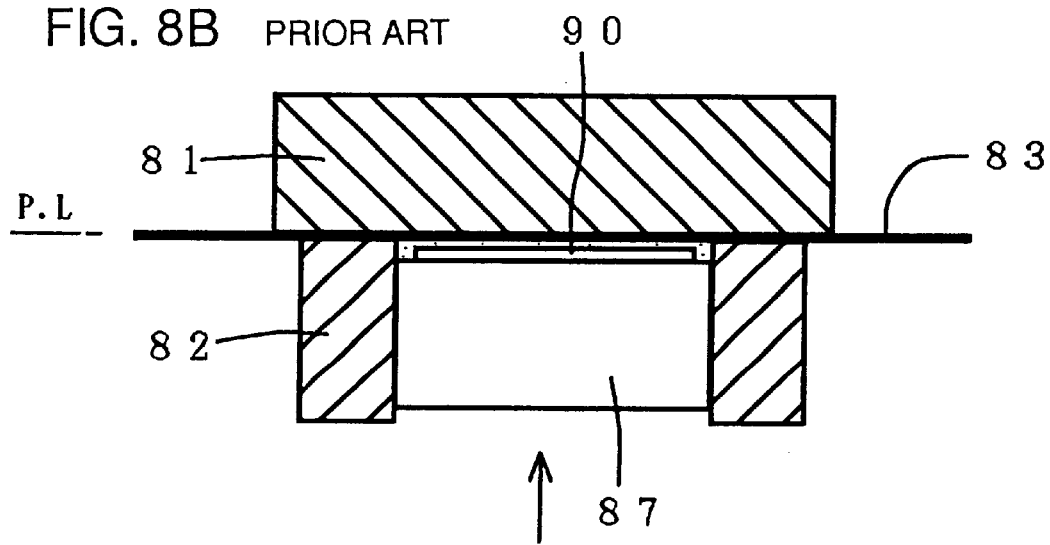

It is noted that resin-coated wafer 12 (see FIG. 7A) formed in each of the above described embodiments is cut into chips 13 shown in FIG. 7B. As a result, resin-coated chip 14 is formed as shown in FIG. 7C. The leading edge of bump 3 exposed from resin 11 of resin-coated chip 14 is, for example, structured to be electrically connected to a substrate or the like.

Furthermore, in each of the above embodiments, a single cavity is formed in the mold. However, a plurality of cavities may be provided in the mold. In addition, although the resin material in a powder or particle form is used, a resin material in a possible various forms such as resin tablets may be employed. Although a thermosetting resin material is used in each of the above described embodiments, a thermoplastic resin material or the like may be employed.

Furthermore, in each of the above embodiments, transfer mold method using a liquid resin material instead of a powder or particle resin material may be employed. In this case, a required amount of liquid resin material is applied to the cavity and the upper and lower molds are closed, or the liquid resin material is introduced to the cavity by application of a pressure after the upper and lower molds are closed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of coating a semiconductor wafer with resin comprising the steps of:

placing a semiconductor wafer with a bump in a prescribed position on a bottom surface of a cavity formed in a molding surface of one of opposed molds for resin coating with a surface of said semiconductor wafer having said bump facing upward;

supplying a required amount of a resin material in said cavity;

applying a film for exposing said bump onto a molding surface of the other of said molds;

closing said molds together;

heating to melt said resin material in said cavity;

pressing said film against said bottom surface of said cavity by a pressing member provided on said molding surface of said other mold;

abutting said film against a leading edge of said bump in said cavity in said pressing step; and coating said surface having said bump of said semiconductor wafer with said resin by applying a pressure to said resin on said cavity through said film in said pressing step.

2. The method of coating the semiconductor wafer with resin according to claim 1, wherein said cavity is provided in the molding surface of said lower mold, and said pressing member is provided on said upper mold.

3. The method of coating the semiconductor wafer with resin according to claim 2, wherein said film is applied onto said molding surface of said upper mold in said film applying step.

4. The method of coating the semiconductor wafer with resin according to claim 2, wherein said film is attracted and fixed to said molding surface of said upper mold in said film applying step.

5. The method of coating the semiconductor wafer with resin according to claim 4, wherein said semiconductor supplying step includes the step of attracting and fixing said semiconductor wafer to said bottom surface of said cavity.

6. The method of coating the semiconductor wafer with resin according to claim 4, wherein said step of closing said molds is performed with a prescribed vacuum being drawn at least into said cavity.

7. The method of coating the semiconductor wafer with resin according to claim 2, wherein said resin coating step is performed with a prescribed vacuum being drawn at least into said cavity.

8. The method of coating the semiconductor wafer with resin according to claim 1, wherein said resin coating step is performed with a prescribed vacuum being drawn at least into said cavity.

9. The method of coating the semiconductor wafer with resin according to claim 1, wherein said film is attracted and fixed to said molding surface of said other mold in said film applying step.

10. The method of coating the semiconductor wafer with resin according to claim 9, wherein said semiconductor supplying step includes the step of attracting and fixing said semiconductor wafer to said bottom surface of said cavity.

11. The method of coating the semiconductor wafer with resin according to claim 9, wherein said step of closing said molds is performed with a prescribed vacuum being drawn at least into said cavity.

12. A molding apparatus for coating with resin a surface of a semiconductor wafer having a bump, comprising:

placing means for placing a semiconductor wafer with a bump in a prescribed position on a bottom surface of a cavity formed in a molding surface of one of opposed molds for resin coating, with a surface of said semiconductor wafer having said bump facing upward;

supplying means for supplying a required amount of a resin material into said cavity;

applying means for applying a film for exposing said bump onto a molding surface of the other of said molds;

closing means for closing said molds together;

heating means for heating at least said resin material to melt said resin material in said cavity;

pressing means for pressing said film against said bottom surface of said cavity, including a pressing member provided on said molding surface of said other mold, and for abutting said film against a leading edge of said bump in said cavity; and coating means for coating said surface having said bump of said semiconductor wafer with said resin by applying a pressure to said resin on said cavity through said film while pressing said film against said bottom surface of said cavity.

13. The molding apparatus according to claim 12, wherein:

said opposed molds include a stationary mold and a movable mold with their molding surfaces opposed, with said cavity provided in one of said molding surfaces of said stationary mold and said movable mold; and said heating means include a heater to melt said resin material in said cavity.

14. The molding apparatus according to claim 13, further comprising adjusting means for adjusting said surface with said bump of said semiconductor wafer placed on said bottom surface of said cavity and a pressing surface of said pressing member such that they are almost in parallel to each other.

15. The molding apparatus according to claim 13, further comprising means for attracting and fixing said film to said molding surface of said other mold provided with said pressing member.

16. The molding apparatus according to claim 15, further comprising means for attracting and fixing said semiconductor wafer to said bottom surface of said cavity.

17. The molding apparatus according to claim 13, further comprising means for drawing a prescribed vacuum at least in said cavity.

* * * * *